United States Patent
Liu et al.

(10) Patent No.: US 10,818,244 B2
(45) Date of Patent: Oct. 27, 2020

(54) DISPLAY PANEL, MANUFACTURING METHOD THEREOF, AND DISPLAY DEVICE

(71) Applicants: BOE Technology Group Co., Ltd., Beijing (CN); Chengdu BOE Optoelectronics Technology Co., Ltd., Chengdu (CN)

(72) Inventors: Tingliang Liu, Beijing (CN); Weiyun Huang, Beijing (CN); Yue Long, Beijing (CN); Xiangdan Dong, Beijing (CN); Yang Wang, Beijing (CN)

(73) Assignees: BOE TECHNOLOGY GROUP CO., LTD., Beijing (CN); CHENGDU BOE OPTOELECTRONICS TECHNOLOGY CO., LTD, Sichuan Province (CN)

(*) Notice: Subject to any disclaimer, the term of this patent is extended or adjusted under 35 U.S.C. 154(b) by 81 days.

(21) Appl. No.: 16/077,079

(22) PCT Filed: Feb. 8, 2018

(86) PCT No.: PCT/CN2018/075868
§ 371 (c)(1),
(2) Date: Aug. 10, 2018

(87) PCT Pub. No.: WO2019/000959
PCT Pub. Date: Jan. 3, 2019

(65) Prior Publication Data
US 2019/0147803 A1 May 16, 2019

(30) Foreign Application Priority Data

Jun. 28, 2017 (CN) .......................... 2017 1 0510226

(51) Int. Cl.
*G09G 3/3291* (2016.01)
*G09G 3/3233* (2016.01)
(Continued)

(52) U.S. Cl.
CPC ......... *G09G 3/3291* (2013.01); *G09G 3/3208* (2013.01); *G09G 3/3233* (2013.01);
(Continued)

(58) Field of Classification Search
CPC .................. G09G 3/32; G09G 3/3208; G09G 3/3225–3291; G09G 3/36–3696;
(Continued)

(56) References Cited

U.S. PATENT DOCUMENTS

2002/0018060 A1* 2/2002 Yamazaki ............ G09G 3/3275
345/211
2016/0291376 A1* 10/2016 Iwatsu .............. G02F 1/133512
(Continued)

FOREIGN PATENT DOCUMENTS

CN 104809980 A 7/2015
CN 105185815 A 12/2015
(Continued)

OTHER PUBLICATIONS

Office Action for CN Application No. 201710510226.X dated Jun. 28, 2018 (references previously cited).
(Continued)

*Primary Examiner* — Nathan Danielsen
(74) *Attorney, Agent, or Firm* — Fay Sharpe LLP

(57) ABSTRACT

A display panel, a manufacturing method thereof, and a display device are provided. The display panel has a display region and a non-display region, and includes a base substrate and a plurality of pixels arranged on the base substrate, in which the plurality of pixels includes a plurality of first pixels and a plurality of second pixels, the plurality of first pixels is arranged in an array in first arrangement region, the plurality of second pixels is arranged in a periphery of the first arrangement region, one part of each of the second pixels is in second arrangement region and the other part
(Continued)

thereof is in third arrangement region, the first arrangement region and the second arrangement region is disposed in the display region, and the third arrangement region is disposed in the non-display region. The display uniformity is improved, and the display effect is enhanced.

12 Claims, 8 Drawing Sheets

(51) Int. Cl.
*H01L 27/32* (2006.01)
*G09G 3/3208* (2016.01)
*H01L 51/56* (2006.01)

(52) U.S. Cl.
CPC .......... *H01L 27/3218* (2013.01); *H01L 51/56* (2013.01); *G09G 2300/08* (2013.01); *G09G 2320/0233* (2013.01); *H01L 27/3223* (2013.01)

(58) Field of Classification Search
CPC ... G09G 2300/0404; G09G 2300/0413; G09G 2300/0439; G09G 2300/0452; G09G 2300/08; G09G 2310/027; G09G 2310/0272; G09G 2310/0289; G09G 2320/02; G09G 2320/0204; G09G 2320/0233; G09G 2320/0686; G09G 2330/028; H01L 27/3211; H01L 27/3218; H01L 27/3223; H01L 51/56
See application file for complete search history.

(56) References Cited

U.S. PATENT DOCUMENTS

2017/0337876 A1* 11/2017 Kim ..................... G09G 3/3266
2018/0144675 A1* 5/2018 Lee ..................... G09G 3/2003

FOREIGN PATENT DOCUMENTS

| | | |
|---|---|---|
| CN | 106033656 A | 10/2016 |
| CN | 106449725 A | 2/2017 |
| CN | 107093406 A | 8/2017 |
| JP | 2006-331209 A | 12/2006 |

OTHER PUBLICATIONS

Office Action for CN Application No. 201710510226.X dated Nov. 28, 2018.
International Search Report dated May 14, 2018 in PCT/CN2018/075868.

* cited by examiner

DISPLAY PANEL, MANUFACTURING METHOD THEREOF, AND DISPLAY DEVICE

This application is a 371 of PCT Patent Application Ser. No. PCT/CN2018/075868, filed on Feb. 8, 2018, which claims priority to Chinese Patent Application No. 201710510226.X, filed with the State Intellectual Property Office on Jun. 28, 2017 and titled "DISPLAY PANEL, MANUFACTURING METHOD THEREOF, AND DISPLAY DEVICE", the entire contents of which are incorporated herein by reference.

TECHNICAL FIELD

The present disclosure relates to, but is not limited to a display panel, a manufacturing method thereof, and a display device.

BACKGROUND

With the development of the display technology, organic light-emitting diodes (OLEDs), as current-type light-emitting devices, are more and more widely applied in high performance display field because of advantages such as self-luminescence, quick response, wide view angle and the like.

For example, an OLED may be applied to the field of smart wearable display devices. A smart wearable display device generally has a non-rectangular display panel, for example, a circular display panel. However, in the related art, an OLED display panel generally has rectangular pixels. The rectangular pixels less match a non-rectangular display panel.

SUMMARY

The embodiments of the present disclosure provide a display panel, a manufacturing method thereof, and a display device.

In a first aspect, there is provided a display panel, comprising the display panel has a display region and a non-display region, and the display panel comprises:

a base substrate and a plurality of pixels arranged on the base substrate;

herein, the plurality of pixels comprise a plurality of first pixels and a plurality of second pixels, the plurality of first pixels being arranged in an array in a first arrangement region, the plurality of second pixels being arranged in a periphery of the first arrangement region, one part of each of the second pixels being in a second arrangement region and the other part thereof being in a third arrangement region, the first arrangement region and the second arrangement region being in the display region, and the third arrangement region being in the non-display region.

Optionally, the display panel further comprises a pixel driving circuit; wherein the pixel driving circuit is configured to drive the plurality of pixels to emit light, and each of the pixels comprises at least two subpixels; and the pixel driving circuit comprises a target signal line, the target signal line comprising a first target signal line and a second target signal line, and a load voltage on the first target signal line being greater than a load voltage on the second target signal line;

wherein a target subpixel in each of the second pixels is connected to the first target signal line, one part of each of the target subpixels being in a second arrangement region and the other part thereof being in a third arrangement region, and the subpixels except for the target subpixels in the plurality of pixels are all connected to the second target signal line.

Optionally, a resistor is arranged between each of the target subpixels and the corresponding first target signal line, a resistance of the resistor being positively correlated with a size of a light-emitting region of the target subpixel, and the voltages loaded to the target subpixels being all greater than the load voltage on the second target signal line.

Optionally, the display panel further comprises a pixel driving circuit; wherein the pixel driving circuit is configured to drive the plurality of pixels to emit light, and each of the pixels comprises at least two subpixels; and the pixel driving circuit comprises a target signal line, each of the subpixels being connected to the target signal line, wherein a resistor is arranged between each of the subpixels and the target signal line, a resistance of the resistor being positively correlated with a size of a light-emitting region of the subpixel.

Optionally, the pixel driving circuit further comprises a data signal line; wherein each of the subpixels is connected to the data signal line, and the data signal line is configured to supply a data voltage for a corresponding subpixel.

Optionally, the target signal line is a power signal line or a reference signal line.

Optionally, each of the pixels comprises a red subpixel, a green subpixel and a blue subpixel.

Optionally, the display panel is a circular display panel, and each of the pixels is a rectangular pixel.

Optionally, the display panel is an AMOLED display panel.

Optionally, the pixel driving circuit is arranged on the base substrate, or the pixel driving circuit is arranged independently of the base substrate.

In a second aspect, there is provided a manufacturing method for a display panel, wherein the display panel has a display region and a non-display region, and the method comprises:

providing a base substrate; and forming a plurality of pixels on the base substrate;

herein the plurality of pixels comprise a plurality of first pixels and a plurality of second pixels, the plurality of first pixels being arranged in an array in a first arrangement region, the plurality of second pixels being arranged in a periphery of the first arrangement region, one part of each of the second pixels being in a second arrangement region and the other part thereof being in a third arrangement region, the first arrangement region and the second arrangement region being in the display region, and the third arrangement region being in the non-display region.

Optionally, each of the pixels comprises at least two pixels, and the method further comprises:

providing a pixel driving circuit, the pixel driving circuit comprising a target signal line, the target signal line comprising a first target signal line and a second signal target line;

connecting a target subpixel in each of the second pixels to the first target signal line, the first target signal line being configured to load a first voltage to the target subpixels in the second pixels, one part of each of the target subpixels being in a second arrangement region and the other part thereof being in a third arrangement region; and connecting the subpixels except for the target subpixels in the plurality of pixels to the second target signal line, the second target signal line being configured to load a second voltage to the subpixels except for the target subpixels in the plurality of pixels;

wherein the first voltage is greater than the second voltage.

Optionally, the method further comprises: arranging a resistor between each of the target subpixels and the corresponding first target signal line, a resistance of the resistor being positively correlated with a size of a light-emitting region of the target subpixel, and the voltages loaded to the target subpixels being all greater than the second voltage.

Optionally, each of the pixels comprises at least two pixels, and the method further comprises:

providing a pixel driving circuit, the pixel driving circuit comprising a target signal line; and connecting each of the subpixels to the target signal line, and arranging a resistor between each of the subpixels and the target signal line, the target signal line being configured to load a third voltage to each of the subpixels;

wherein a resistance of the resistor is positively correlated with a size of a light-emitting region of the subpixel.

Optionally, the pixel driving circuit further comprises a data signal line, and the method further comprises:

connecting each of the subpixels to the data signal line, and the data signal line being configured to supply a data voltage for a corresponding subpixel.

Optionally, the target signal line is a power signal line or a reference signal line.

In a third aspect, there is provided a display device, comprising any one of the display panels described in the first aspect.

To sum up, a display panel, a manufacturing method thereof and a display device are provided. The display panel includes a plurality of pixels. The plurality of pixels include a plurality of second pixels. One part of each of the second pixels are in a second arrangement region of the display region and the other part thereof being in a third arrangement region of the non-display region.

DETAILED DESCRIPTION

To make the principle and advantages of the present disclosure clearer, embodiments of the present disclosure are described hereinafter in detail with reference to the drawings.

Figure 1:
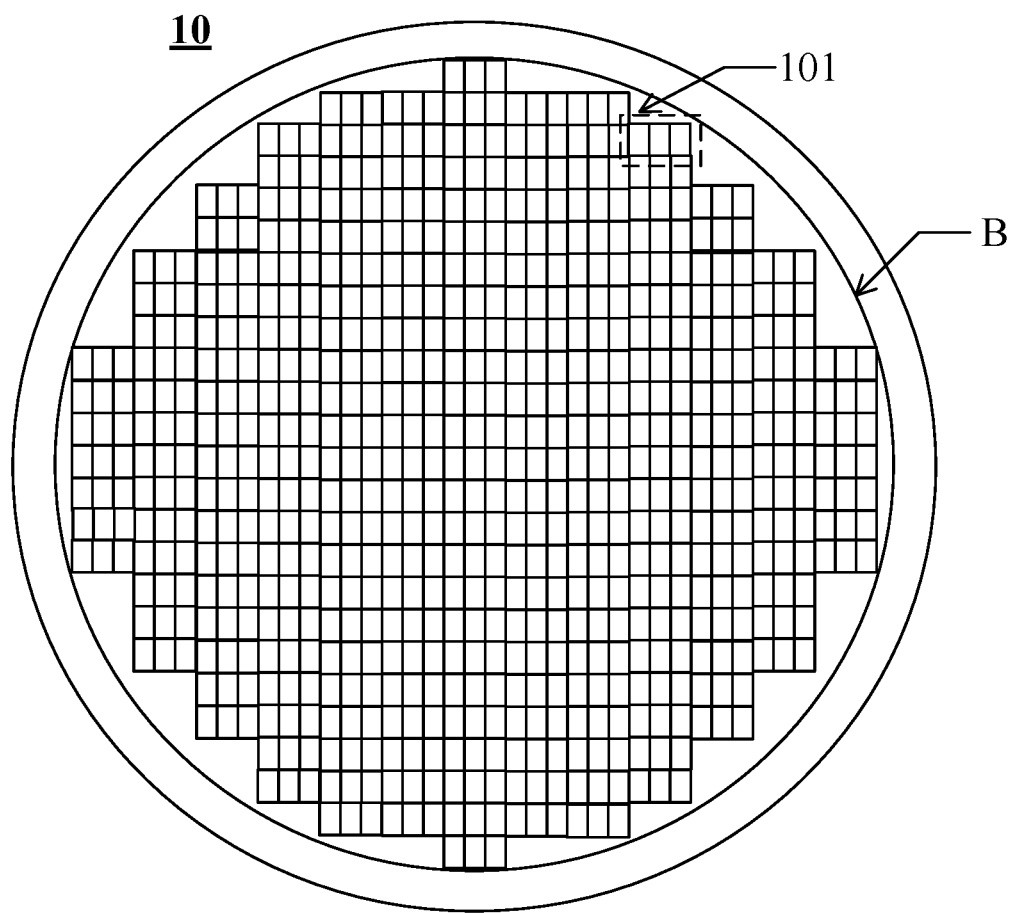
FIG. 1 is a schematic diagram of a structure of a display panel in the related art.

In the related art, a rectangular pixel less matches a non-rectangular display panel. Taking a circular OLED display panel as an example, as illustrated in FIG. 1, when pixels in a circular OLED display panel 10 are rectangular pixels 101, edges of the rectangular pixels 101 at edge positions of the circular OLED display panel fail to totally coincide with an edge B of the circular OLED display panel, and the rectangular pixels 101 at the edge positions are zigzag arranged.

Figure 2:
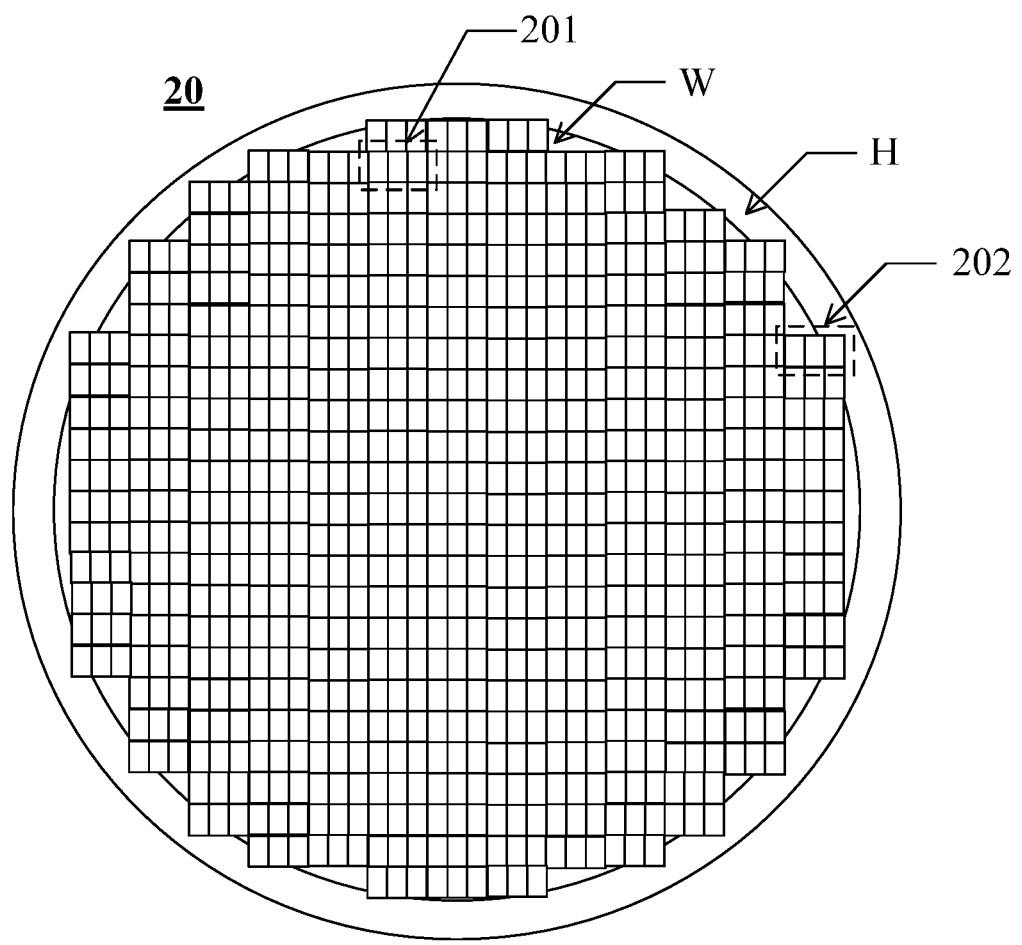
FIG. 2 is a schematic view of a structure of a display panel according to an embodiment of the present disclosure.

There provides a display panel 20 in embodiments of the present disclosure. The display panel 20 may be an active matrix organic light-emitting diode (AMOLED) display panel. As illustrated in FIG. 2, the display panel 20 has a display region W and a non-display region H, and the display panel 20 includes:

a base substrate and a display unit arranged on the base substrate; wherein the display unit includes a plurality of pixels and a pixel driving circuit. The pixel driving circuit is configured to drive the plurality of pixels to emit light. Alternatively, the pixel driving circuit may be arranged independently of the base substrate. For example, the pixel driving circuit may be arranged on a periphery of the base substrate, and may be connected to the plurality of pixels on the base substrate via a signal line. Alternatively, the pixel driving circuit may also be bonded to the plurality of pixels on the base substrate via a chip on film (COF) technique.

Herein, the plurality of pixels include a plurality of first pixels 201 and a plurality of second pixels 202. The plurality of first pixels 201 are arranged in an array in a first arrangement region, the plurality of second pixels 202 are arranged in a second arrangement region, and each of the second pixels 202 are simultaneously disposed in a second arrangement region and a third arrangement region. That is, one part of each of the second pixels 202 is disposed in the second arrangement region and the other part thereof is disposed in the third arrangement region. The first arrangement region and the second arrangement region are disposed in a display region W, and the third arrangement region is disposed in a non-display region H.

It should be noted that FIG. 2 is illustrated by taking the scenario where the display panel is a circular display panel and the pixels are rectangular pixels as an example. In this case, the display region is a circular display region, and the non-display region is a circular annular display region. Nevertheless, the display panel may also be an elliptical display panel. In this case, the display region is an elliptical display region, and the non-display region is an elliptical annular display region. This embodiment of the present disclosure sets no limitation to the shape of the display panel.

In summary, the display panel according to this embodiment of the present disclosure includes a plurality of pixels. The plurality of pixels include a plurality of second pixels. Since one part of each of the second pixels is disposed in a second arrangement region the display region and the other part thereof is disposed in a third arrangement region of the non-display region, by adding more second pixels, a coverage rate of the pixels at the edge positions of the display region is improved, and zigzags appearing at the edge of the display panel are eliminated, graininess of the image displayed at the edge of the display region is mitigated, and thus a display effect of the display panel is improved.

Figure 3:
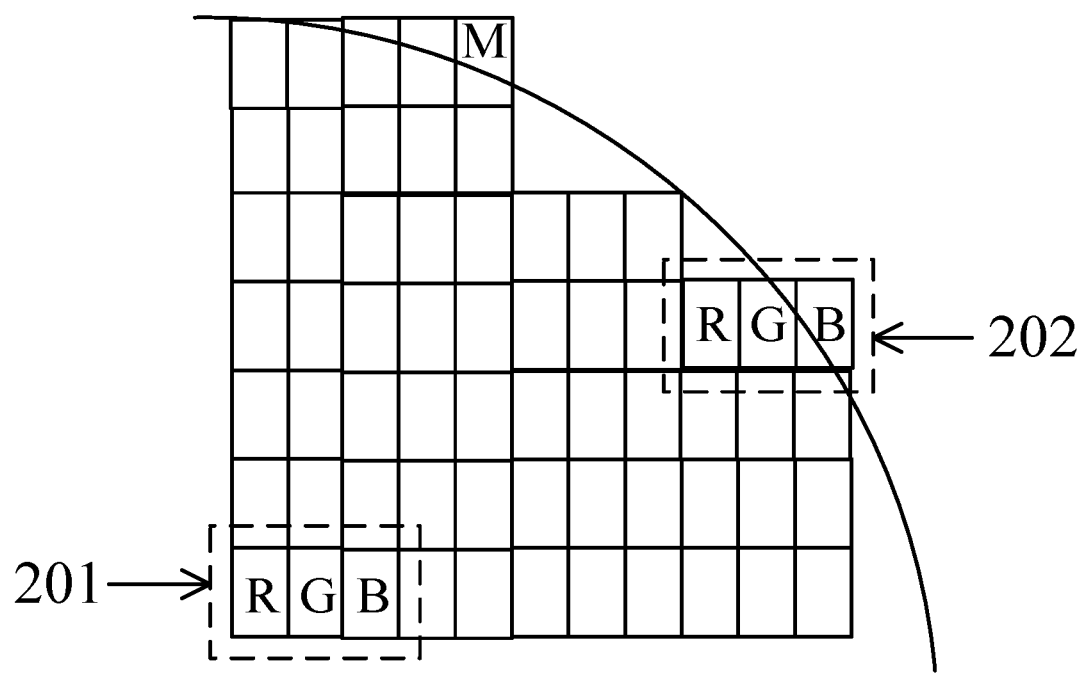
FIG. 3 is a partially enlarged view of the display panel in FIG. 2.

It should be noted that each pixel may include at least two subpixels. This embodiment of the present disclosure is described by using the scenario where each pixel includes three subpixels as an example. FIG. 3 is a partially enlarged view of the display panel 20 illustrated in FIG. 2. As illustrated in FIG. 3, the three subpixels are respectively a red subpixel R, a green subpixel G and a blue subpixel B.

In embodiments of the present disclosure, each subpixel may be correspondingly provided with a pixel circuit. That is, each subpixel may include a pixel circuit and a light-emitting unit. The pixel circuit in each subpixel may be connected to the pixel driving circuit via a signal line. The pixel circuit in each subpixel may drive, under drive of the pixel driving circuit, drives the corresponding light-emitting unit to emit light. The pixel driving circuit may include an integrated circuit (IC) chip configured to provide data signals, and a driving signal end configured to provide a direct current signal voltage; or the pixel driving circuit may further include a driving signal end configured to provide a reference signal voltage. The pixel circuit in each subpixel may be connected to the IC chip via a data signal line, may be connected to the driving signal end configured to provide the direct current signal voltage via a power signal line, and may be connected to the driving signal end configured to provide the reference signal voltage via a reference signal line.

Herein, the IC chip may also be referred to as a source driving IC. Each driving signal end may be integrated on the IC chip, or may be arranged independently of the IC chip, that is, may be integrated on another IC chip, which is not limited in this embodiment of the present disclosure.

Figure 4:
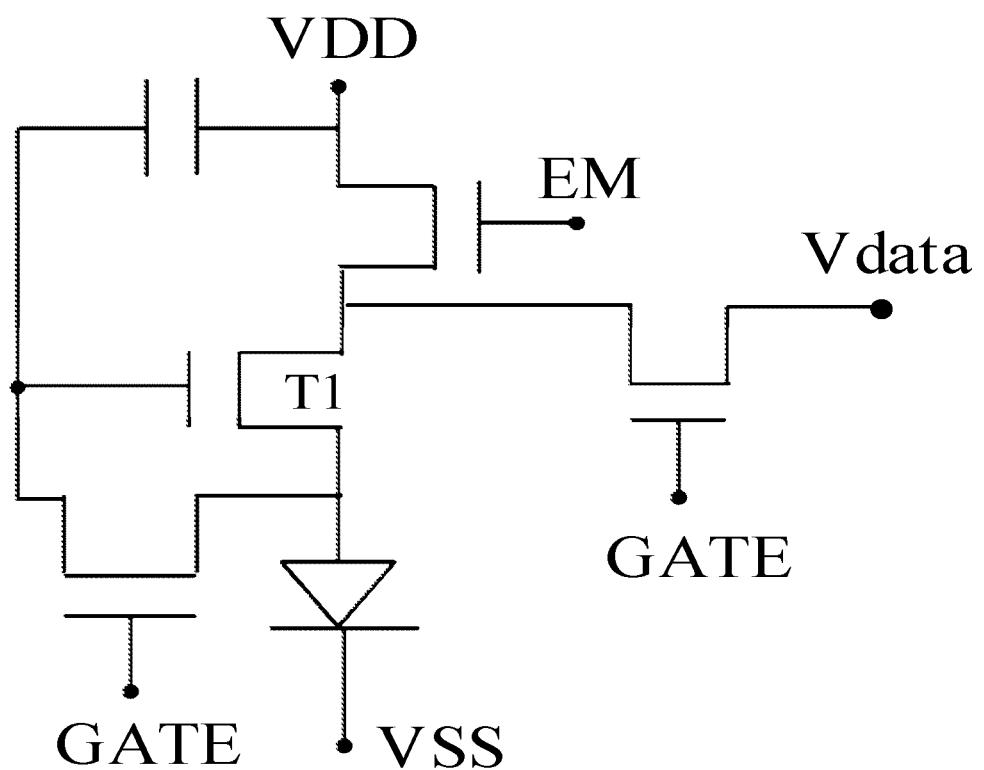
FIG. 4 is a view of control circuit of a subpixel in the related art.

As one optional implementation of embodiments of the present disclosure, each subpixel may be correspondingly provided with a pixel circuit as illustrated in FIG. 4. Referring to FIG. 4, VDD in the pixel circuit is a direct current signal voltage, a VDD terminal is connected to the power signal line in the pixel driving circuit, Vdata is a data voltage, and a Vdata terminal is connected to the IC chip in the pixel driving circuit via a data signal line. In addition, the pixel circuit may be respectively connected to a gate driving terminal GATE, an enable signal terminal EM and a low power terminal VSS. The gate driving terminal GATE, the enable signal terminal EM and the low power terminal VSS may be respectively connected to the IC chip in the pixel driving circuit via a signal line.

When each subpixel is correspondingly provided with a pixel circuit as illustrated in FIG. 4, a current I (that is, a driving current for driving the light-emitting unit to emit light) flowing through the subpixel may be calculated based on the following formula (1):

$$I = \frac{k}{2} \times (V_{data} - VDD)^2 \quad (1)$$

As seen from formula (1), the current I flowing through the subpixel is related to the data voltage Vdata and the direct current signal voltage VDD, and the direct current signal voltage VDD is generally 6 V, and the data voltage Vdata is generally 0 V or negative. Therefore, generally, the greater the direct current signal voltage VDD, the greater the current I. Herein, $$k = u * Cox * \frac{W}{L},$$

u is a field-effect migration rate (which is also referred to as a carrier migration rate) of a field-effect transistor T1 in the pixel circuit as illustrated in FIG. 4, Cox is a capacitance of a unit area of insulating layer, that is, a capacitance in a unit area on a gate insulating layer of the field-effect transistor T1, and $$\frac{W}{L}$$

is a channel wide-to-length ratio of the field-effect transistor T1, wherein the field-effect transistor T1 is a driving transistor in the pixel circuit.

Figure 5:
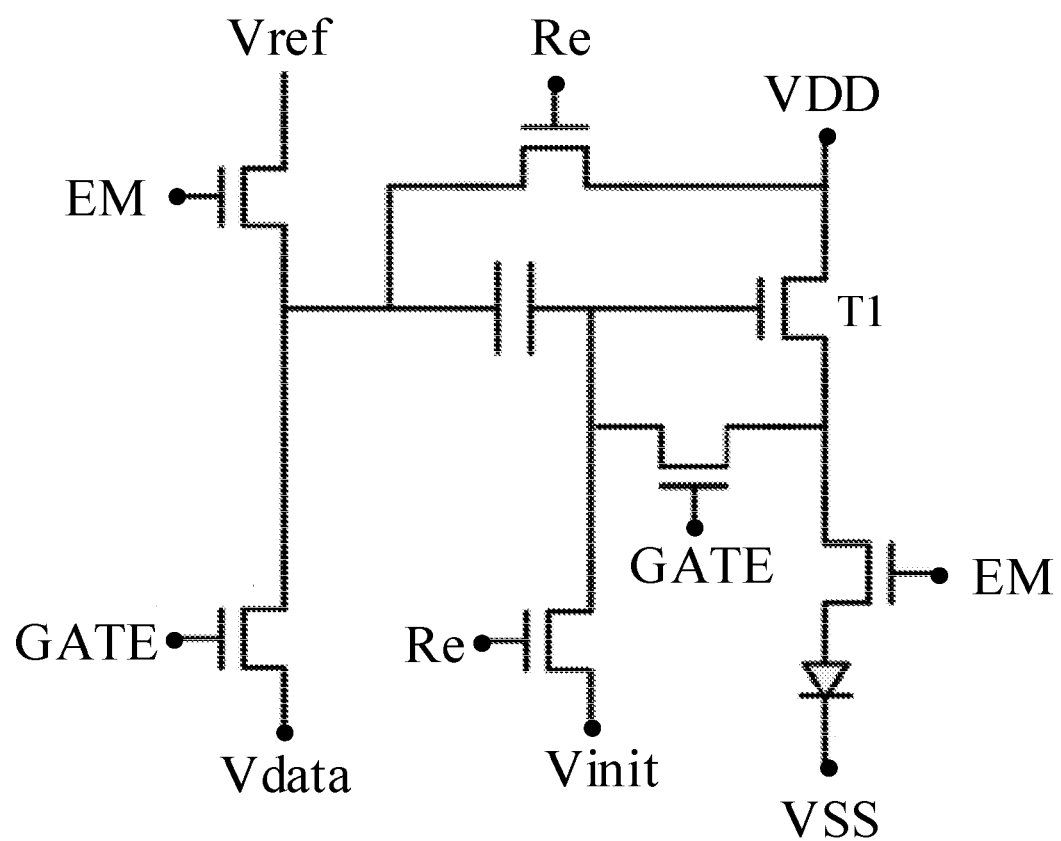
FIG. 5 is a view of control circuit of another subpixel in the related art.

As another optional implementation of embodiments of the present disclosure, each subpixel may be further correspondingly provided with a pixel circuit as illustrated in FIG. 5. Referring to FIG. 5, Vref is a reference voltage, and a Vref terminal is connected to a reference signal line in the pixel driving circuit, Vdata is a data voltage, and a Vdata terminal is connected to the IC chip in the pixel driving circuit via a data signal line. In addition, the pixel circuit may be further connected to a gate driving terminal GATE, an enable signal terminal EM, a low power terminal VSS, a reset signal terminal Re and an initializing signal terminal Vinit respectively. The gate driving terminal GATE, the low power terminal VSS, the reset signal terminal Re and the initializing signal terminal Vinit may be respectively connected to the IC chip in the pixel driving circuit via a signal line.

When each subpixel is correspondingly provided with a pixel circuit as illustrated in FIG. 5, a current I (that is, a driving current for driving the light-emitting unit to emit light) flowing through the subpixel may be calculated based on the following formula (2):

$$I = \frac{k}{2} \times (V_{data} - V_{ref})^2 \quad (2)$$

As seen from formula (2), the current I flowing through the subpixel is related to the data voltage Vdata and the reference voltage Vref, and the reference voltage Vref is generally 6 V, and the data voltage Vdata is generally 0 V or negative. Therefore, generally, the greater the reference voltage Vref, the greater the current I. Herein, $$k = u * Cox * \frac{W}{L},$$

u is a field-effect migration rate (which is also referred to as a carrier migration rate) of a field-effect transistor T1 in the pixel circuit as illustrated in FIG. 5, Cox is a capacitance of a unit area of insulating layer, that is, a capacitance in a unit area on a gate insulating layer of the field-effect transistor T1, and $$\frac{W}{L}$$

is a channel wide-to-length ratio of the field-effect transistor T1, wherein the field-effect transistor T1 is a driving transistor in the pixel circuit.

Since one part of each of the second pixels is disposed in the second arrangement region and the other part thereof is disposed in the third arrangement region, and each of the second pixels includes a plurality of subpixels, in each of the second pixels, there exists target subpixels one part of which is located in the second arrangement region and the other part of which is located in the third arrangement region. Further, since the third arrangement region is in the non-display region, an aperture ratio (the aperture ratio of the pixel is a ratio of a light transmission surface to a pixel area, and the light transmission area refers to an area of an effective light transmission region during display) of the target subpixels in each second pixel is less than an aperture ratio of other subpixels. In embodiments of the present disclosure, a light-emitting intensity AP1 of the effective light transmission region of each subpixel may satisfy AP1=w×AP0; wherein AP0 refers to a light-emitting intensity of an actual light transmission region of the subpixel, and w refers to an area ratio of the effective light transmission area to the actual light transmission area.

For example, assume that a target subpixel M in the second pixel 202 shown in FIG. 3 is a blue subpixel, and an aperture ratio thereof is less than an aperture ratio of a normal blue subpixel B, that is, an area of a light-emitting region of the target subpixel M is less than an area of a light-emitting region of the normal blue subpixel B. As a result, when a same current is loaded to the target subpixel M and the normal blue subpixel B, the target subpixel has a lower luminance.

To solve the above problem, according to the present disclosure, by regulating the current in each of the subpixels (that is, a driving current input by the pixel circuit in each subpixel to the light-emitting unit), a display luminance that is reduced due to reduction of an aperture ratio of target subpixels is compensated.

In practice, in addition to the pixel circuits as illustrated in FIG. 4 and FIG. 5, each subpixel may be further provided with other pixel circuits correspondingly. In this case, factors affecting the magnitude of the current flowing through the subpixel (that is, the driving current for driving the light-emitting unit to emit light) may be changed. According to embodiments of the present disclosure, it is intended to make a compensation for the display luminance of the subpixel with a decreased aperture ratio by regulating the magnitude of the current flowing through the subpixel. The pixel circuits as illustrated in FIG. 4 and FIG. 5 are merely for illustrative description, and this embodiment of the present disclosure sets no limitation to the pixel circuit applied in the display panel.

In embodiments of the present disclosure, each subpixel may be connected to a target signal line in the pixel driving circuit. Exemplarily, when each subpixel corresponds to a pixel circuit as illustrated in FIG. 4, the target signal line is a power signal line; and when each subpixel corresponds to a pixel circuit as illustrated in FIG. 5, the target signal line is a reference signal line. In practice, the target signal line may also be other signal lines correlated to the current in the subpixel, which is not limited in this embodiment of the present disclosure.

In the embodiments of the present disclosure, descriptions are given by taking the following two manners of regulating the current in each subpixel as an example.

In a first regulation manner, each target signal line includes a first target signal line and a second target signal line, and a voltage loaded to the first target signal line is greater than a voltage loaded to the second target signal line. The target subpixels in each of the second pixels are connected to the first target signal line, and the subpixels except for the target subpixels in the plurality of pixels are all connected to the second target signal line. Since the voltage loaded to the first target signal line is grater than the voltage loaded to the second target signal line, the current in the target subpixels connected to the first target signal line is greater than the current in the subpixels except for the target subpixels connected to the second target signal line, such that the display luminance of the target subpixels with a small aperture ratio is compensated as much as possible, and thus display uniformity at the edge positions of the display region may be improved.

Figure 6:
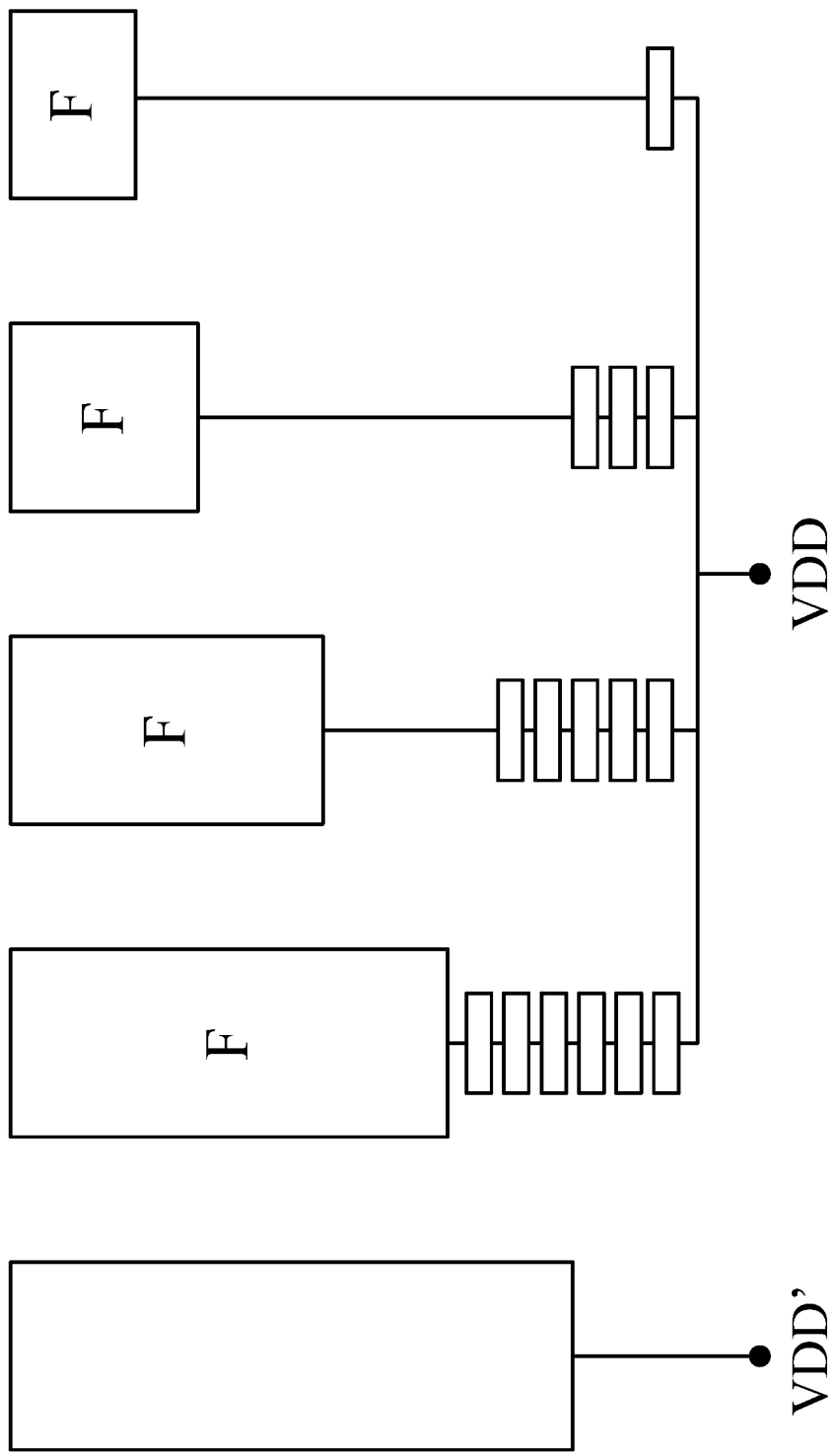
FIG. 6 is a schematic view of a relationship between an area of a light-emitting region in a target subpixel and a resistance of an arranged resistor according to an embodiment of the present disclosure.

Further, a resistor may be arranged between each target subpixel and the corresponding first target signal line (the first target signal line corresponding to each target subpixel refers to a target signal line connected to a pixel circuit in the target subpixel in the pixel driving circuit). FIG. 6 is a schematic view of a relationship between the size of a light-emitting region F in the target subpixel and the magnitude of the resistance of the arranged resistor. The voltage loaded to the first target signal line is a first voltage VDD, and the voltage loaded to the second target signal line is a second voltage VDD'. As illustrated in FIG. 6, the magnitude of the resistance of the resistor (in FIG. 6, the magnitude of the resistance of the resistors is represented by the number of resistors, that is, the more the number of resistors arranged between the target subpixel and the first target signal line, the greater the resistance of the resistors arranged therebetween) is positively correlated with the size of the light-emitting region of the target subpixel (the size of the light-emitting region refers to the size of the area of the light-emitting region, in FIG. 6, the size of the light-emitting region F is represented by the area of the rectangle represents, and the area of the rectangle is positively correlated with the size of the light-emitting region F). That is, the greater the light-emitting region of the target subpixel, the greater the resistance of the resistor arranged between the target subpixel and the corresponding first target signal line. In this way, a target subpixel having a smaller light-emitting region is applied with a greater voltage. In addition, the voltages loaded to all the target subpixels are greater than the second voltage VDD'. This ensures that the display luminance of the target subpixel reduced due to reduction of the aperture ratio thereof is compensated, and further improves display uniformity at the edge positions of the display region. The target subpixels involved in FIG. 6 may be target subpixels in one of the second pixels, or may be target subpixels in more of the second pixels (that is, the four target subpixels in FIG. 6 may be subpixels of the same second pixel or may be subpixels of different second pixels).

Figure 7:
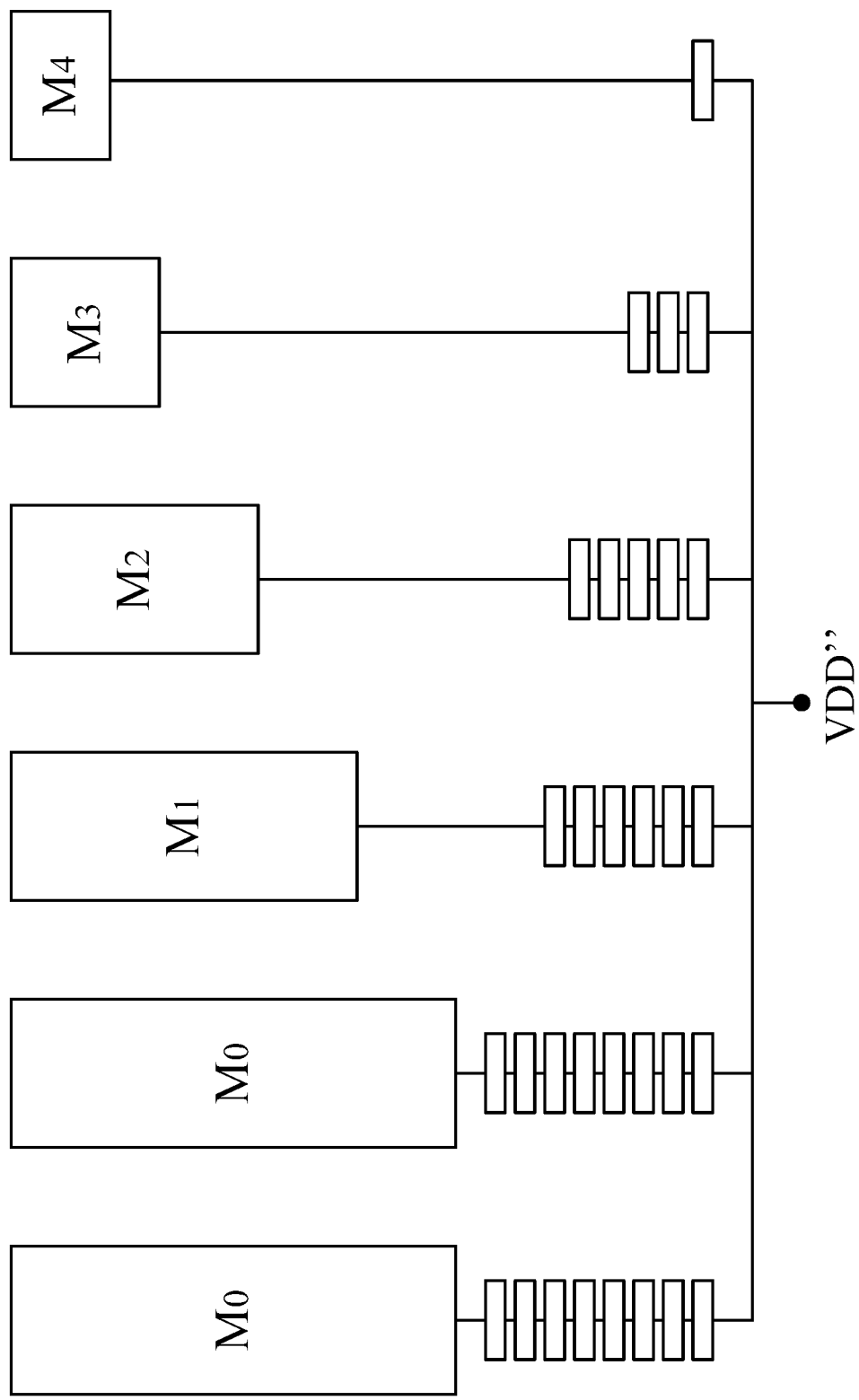
FIG. 7 is a schematic view of a relationship between an area of a light-emitting region in a subpixel and a resistance of an arranged resistor according to an embodiment of the present disclosure.

In a second regulation manner, each of the subpixels are connected to the same target signal line in the pixel driving circuit. A resistance is arranged between each subpixel and the target signal line. FIG. 7 is a schematic view of a relationship between the size of the light-emitting region of the subpixel and the magnitude of the resistance of the arranged resistor. The voltage loaded to the target signal line is a third voltage VDD". As illustrated in FIG. 7, the magnitude of the resistance of the resistor (in FIG. 7 the magnitude of the resistance of the resistors is represented by the number of resistors, that is, the more the number of resistors arranged between the target subpixel and target signal line, the greater the resistance of the resistors arranged therebetween) is positively correlated to the size of the light-emitting region of the subpixel (the size of the light-emitting region refers to the size of the area of the light-emitting region, in FIG. 7, the size of the light-emitting region is represented by the size of the area of the rectangle, and the area of the rectangle is positively correlated with the size of the light-emitting region). The subpixels involved in FIG. 7 include target subpixels and other subpixels except for the target subpixels; wherein M0 represents the size of the area of the light-emitting region of the subpixels except for the target subpixels, and M1, M2, M3 and M4 respectively represent the sizes of the light-emitting regions of the target subpixels. As illustrated in FIG. 7, the resistors arranged between the subpixels except for the target subpixels and the target signal lines have the same magnitude of resistance. The greater the light-emitting region of the target subpixel, the greater the magnitude of the resistance of the resistor arranged between the target subpixel and the target signal line. In this way, the target subpixel having a greater light-emitting region is loaded with a smaller voltage, such that the display luminance of the target subpixel which is reduced due to the decreased aperture ratio thereof can be compensated, thereby improving the display uniformity at the edge positions of the display region.

Optionally, the pixel driving circuit may further include a data signal line. Each subpixel may be connected to the data signal line. The data signal line is configured to provide a data voltage for the corresponding subpixel.

In summary, the display panel according to the embodiments of the present disclosure includes a plurality of pixels. The plurality of pixels include a plurality of second pixels. Since one part of each of the second pixels is disposed in a second arrangement region the display region and the other part thereof is disposed in a third arrangement region of the non-display region, by adding more second pixels, a coverage rate of the pixels at the edge positions of the display region is improved, and zigzags appearing at the edge of the display panel are eliminated, graininess of the image displayed at the edge of the display region is mitigated. Further, the current in the subpixels of each pixel is regulated, such that a display brightness of target subpixels, which is reduced due to the decreased aperture ratio thereof, is compensated, thereby improving the display uniformity at the edge positions of the display region, and the display effect of the display panel.

Figure 8:
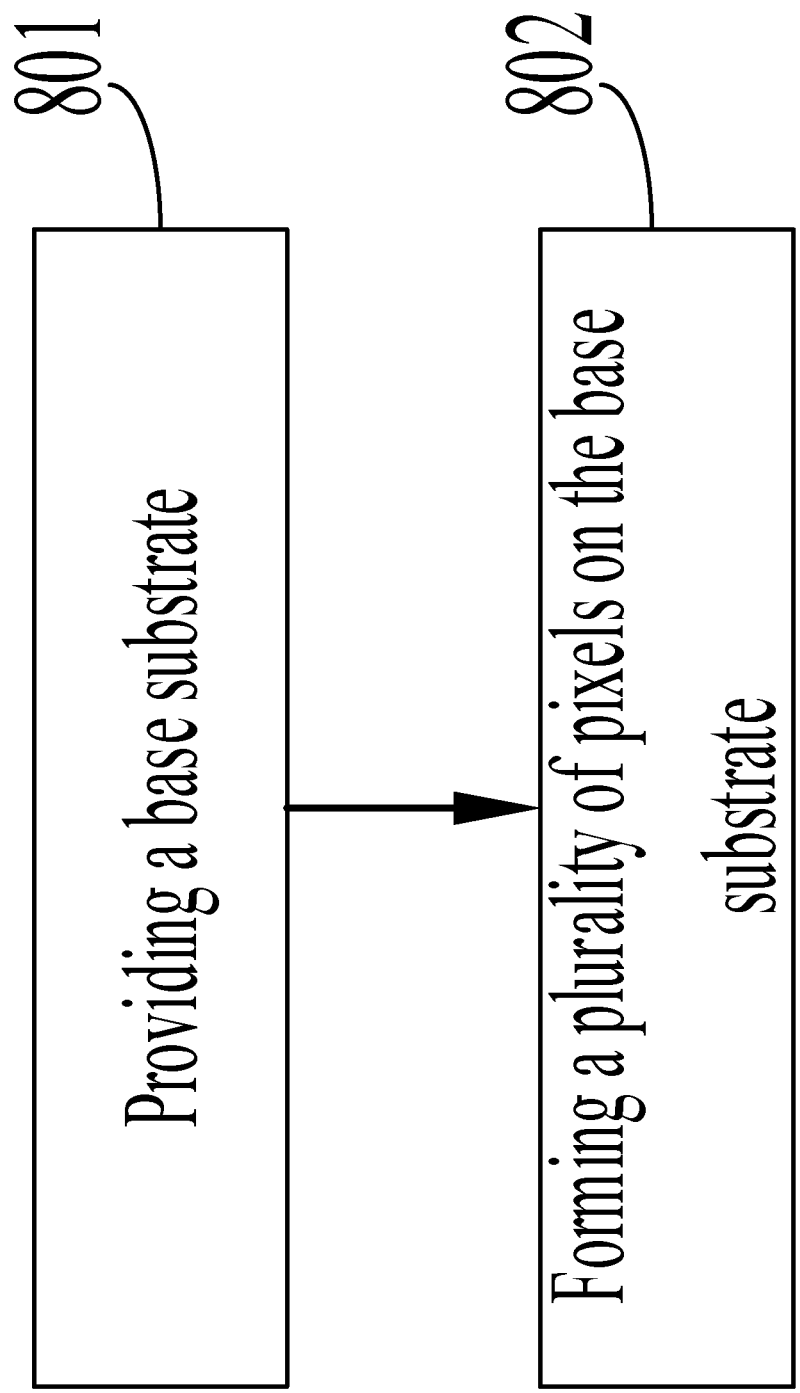
FIG. 8 is a flowchart of a method for manufacturing a display panel according to an embodiment of the present disclosure.

There is provided in an embodiment of the present disclosure a manufacturing method of a display panel. The display panel includes a display region and a non-display region. As illustrated in FIG. 8, the method may include the following steps.

In step 801, a base substrate is provided.

In step 802, a plurality of pixels are formed on the base substrate.

Exemplarily, a display unit may be formed on the base substrate. The display unit may include a plurality of pixels and a pixel driving circuit. The pixel driving circuit is configured to drive the plurality of pixels to emit light. Alternatively, the pixel driving circuit may also be integrated on an IC chip, and may be connected to the plurality of pixels on the base substrate through signal lines, or may be packaged on the base substrate by using COF technique.

Herein, the plurality of pixels comprise a plurality of first pixels and a plurality of second pixels. The plurality of first pixels are arranged in a first arrangement region, and the plurality of second pixels are arranged in a periphery of the first arrangement region. One part of each of the second pixels is disposed in a second arrangement region and the other part thereof is disposed in a third arrangement region. The first arrangement region and the second arrangement region are disposed in a display region, and the third arrangement region is disposed in a non-display region.

In summary, in the manufacturing method of a display panel according to the embodiments of the present disclosure, the display panel includes a plurality of pixels. The plurality of pixels include a plurality of second pixels. Since one part of each of the second pixels is disposed in a second arrangement region the display region and the other part thereof is disposed in a third arrangement region of the non-display region, by adding the second pixels, a coverage rate of the pixels at the edge positions of the display region can be improved, and zigzags appearing at the edge of the display panel can be eliminated, and graininess of the image displayed at the edge of the display region can be mitigated, thereby improving a display effect of the display panel.

In the embodiments of the present disclosure, each of the second pixels may include a target subpixel one part of which is disposed in a second arrangement region and the other part thereof is disposed in a third arrangement region. Since the third arrangement is in the non-display region, an aperture ratio (the aperture ratio of the pixels is a ratio of a light transmission area to a pixel area) of the target subpixel (s) in the second pixels is less than the aperture ratios of other subpixels. For example, it is assumed that a target subpixel M in FIG. 3 is a blue subpixel, and an aperture ratio thereof is less than an aperture ratio of a normal blue subpixel B, that is, an area of a light-emitting region of the target subpixel M is less than an area of a light-emitting region of the normal blue subpixel B. In this way, when the same current is loaded to the target subpixel M and the normal blue subpixel B, the target subpixel has a low luminance.

To solve the above problems, according to the present disclosure, the display luminance of the target subpixel, which is reduced due to the decreased aperture ratio, can be compensated by regulating the current (a driving current input by the pixel circuit to the light-emitting unit in each subpixel) in each of the subpixels.

It should be noted that each subpixel may be provided with a pixel circuit, and each subpixel may be connected to the target signal line in the pixel driving circuit via the pixel circuit. Exemplarily, when the subpixel corresponds to a pixel circuit as illustrated in FIG. 4, the target signal line is a power signal line; and when the subpixel corresponds to a pixel circuit as illustrated in FIG. 5, the target signal line is a reference signal line. In practice, the target signal line may also be other signal lines correlated to the current in the subpixel, which is not limited in the embodiments of the present disclosure.

Correspondingly, as an optional implementation of the embodiments of the present disclosure, after the abovementioned step 802, the method may further include the following steps.

In step 803a, a pixel driving circuit is provided.

The pixel driving circuit includes a target signal line, and the target signal line includes a first target signal line and a second target signal line.

In step 804a, target subpixels in each of the second pixels are connected to the first target signal line.

Herein, the first target signal line is configured to load a first voltage to the target subpixels in the second pixels, and one part of each of the target subpixels is disposed in a second arrangement region and the other part thereof is disposed in a third arrangement region.

In step 805a, subpixels except for the target subpixels in the plurality of pixels are all connected to the second target signal line.

The second target signal line is configured to load a second voltage to the subpixels except for the target subpixels in the plurality of pixels, and the first voltage is greater than the second voltage.

Further, after the step 804*a* mentioned above, the method may further include the following step.

In step 806*a*, a resistor is arranged between each target subpixel and the corresponding first target signal line.

The magnitude of resistance of the resistor is positively correlated with the size of the area of the light-emitting area of the target subpixels, and voltages loaded to the target subpixels are all greater than the second voltage.

It should be noted that, the step 806*a* may be performed simultaneously with the step 804*a*. That is, when the target subpixels in each second pixel are connected to the first target signal line, each of the target subpixels is connected to the first target signal line via the resistor. In addition, the step 805*a* may also be performed simultaneously with the step 804*a*. The sequence for performing the steps in the manufacturing method is not limited in the embodiments of the present disclosure.

As another optional implementation of the embodiments of the present disclosure, after the step 802 mentioned above, the method may further include the following steps.

In step 803*b*, a pixel driving circuit is provided.

The pixel driving circuit may include a target signal line.

In step 804*b*, each of the subpixels is connected to the target signal line, and a resistor is arranged between each of the subpixels and the target signal line.

The target signal line is configured to load a third voltage to each of the subpixels, a magnitude of a resistance of the resistor is positively correlated with a size of a light-emitting region of the subpixel.

Corresponding to the above two implementation manners, the embodiments of the present disclosure are described by taking the following two manners of regulating the current in each subpixel as an example.

In a first regulation manner, each target signal line includes a first target signal line and a second target signal line. The target subpixels in each of the second pixels are connected to the first target signal line, and a first voltage may be loaded to the target subpixels via the first signal line. The subpixels except for the target subpixels in the plurality of pixels are all connected to the second target signal line, and a second voltage may be loaded to the subpixels except for the target subpixels via the second target signal line. Herein, the first voltage is greater than the second voltage. Since the first voltage is greater than the second voltage, the current in the target subpixels connected to the first target signal line is greater than the current in the subpixels except for the target subpixels connected to the second target signal line, such that the display luminance of the target subpixels having a small aperture ratio can be compensated as much as possible, and thereby improving the display uniformity at the edge positions of the display region.

Further, a resistor may be arranged between each target subpixel and the corresponding first target signal line. FIG. 6 is a schematic view of a relationship between the size of the area of a light-emitting region F in the target subpixel and the magnitude of the resistance of the arranged resistor, and reference may be made to the interpretation of FIG. 6 in the above embodiments. As illustrated in FIG. 6, the magnitude of the resistance (in FIG. 6, the magnitude of the resistance of the resistors is represented by the number of resistors) of the resistor is positively correlated with the size of the area of the light-emitting region of the target subpixel. That is, the greater the light-emitting region of the target subpixel, the greater the resistance of the resistor arranged between the target subpixel and the corresponding first target signal line. In addition, the voltages loaded to all the target subpixels are greater than the second voltage. This ensures that the display luminance of the target subpixel, which is reduced due to the decreased aperture ratio thereof is compensated, and further improves display uniformity at the edge positions of the display region. Herein, the target subpixels involved in FIG. 6 may be target subpixels in one of the second pixels, or may be target subpixels in a plurality of the second pixels (that is, the four target subpixels in FIG. 6 may belong to the same second pixel or may belong to different second pixels).

In a second regulation manner, the subpixels are connected to the same target signal line in the pixel driving circuit, and a third voltage is loaded to each subpixel via the target signal line. A resistor is arranged between each subpixel and the target signal line. FIG. 7 is a schematic view of a relationship between the size of the area of the light-emitting region of the subpixel and the magnitude of the resistance of the arranged resistor, and reference may be made to the interpretations of FIG. 7 in the above embodiments. As illustrated in FIG. 7, the magnitude of the resistance of the resistor is positively correlated to the size of the area of the light-emitting region of the subpixel. The subpixels involved in FIG. 7 include target subpixels and other subpixels except for the target subpixels; herein, M0 represents the size of the area of the light-emitting region of the subpixels except for the target subpixels, and M1, M2, M3 and M4 respectively represents the size of the area of the light-emitting region of the target subpixel. As illustrated in FIG. 7, the resistors arranged between the subpixels except for the target subpixels and the target signal lines have the same resistance. The greater the light-emitting region of the target subpixel, the greater the resistance of the resistor arranged between the target subpixel and the target signal line. In this way, the display luminance of the target subpixel, which is reduced due to the decreased aperture ratio thereof can be compensated, thereby improving the display uniformity at the edge positions of the display region.

Optionally, the pixel driving circuit may further include a data signal line, and correspondingly, the manufacturing method may further include:

connecting each of the subpixels to the data signal line, such that a data voltage is loaded to each of the subpixels connected to the data signal line via the data signal line in the pixel driving circuit.

It should be noted that, the sequence of the steps in the manufacturing method of a display panel according to the embodiments of the present disclosure may be suitably adjusted, and the steps may also be reduced or added according to the actual needs. Any variations that is easy to be envisaged within the technical range of the present disclosure by person skilled in the art, shall fall into the protection scope of the present disclosure, which is not described herein any further.

In summary, in the manufacturing method of a display panel according to the embodiments of the present disclosure, the display panel includes a plurality of pixels. The plurality of pixels include a plurality of second pixels. Since one part of each of the second pixels is disposed in a second arrangement region of a display region and the other part thereof disposed in a third arrangement region of a non-display region, by adding the second pixels, a coverage rate of the pixels at the edge positions of the display region can be improved, and zigzags appearing at the edge of the display panel can be eliminated, and graininess of the image displayed at the edge of the display region can be mitigated. Further, the current in the subpixels in each pixel is regulated, such that a display brightness of target subpixels, which is reduced due to of the decreased aperture ratio thereof, is compensated, thereby improving the display uniformity at the edge positions of the display region, and the display effect of the display panel.

A person skilled in the art would clearly acknowledge that for ease and brevity of description, the operation processes in the method embodiment may be referenced to the relevant portions in the above described apparatus embodiment, which are not described herein any further.

There is provided in the embodiments of the present disclosure a display device. The display device includes the display panel shown in FIG. 2 or FIG. 3. The display device may be a liquid crystal panel, an electronic paper, a mobile phone, a tablet computer, a TV, a display, a laptop computer, a digital photo frame, a navigator or any other display apparatus having the product or part with a display function thereof.

In summary, in the display device according to the embodiments of the present disclosure, the display panel includes a plurality of pixels. The plurality of pixels include a plurality of second pixels. Since one part of each of the second pixels is disposed in a second arrangement region of the display region and the other part thereof is disposed in a third arrangement region of the non-display region, by adding the second pixels, a coverage rate of the pixels at the edge positions of the display region can be improved, and zigzags appearing at the edge of the display panel can be eliminated, graininess of the image displayed at the edge of the display region can be mitigated, thereby improving a display effect of the display panel.

The foregoing descriptions are merely optional embodiments of the present disclosure, and are not intended to limit the present disclosure. Within the spirit and principle of the application, any modifications, equivalent substitutions, improvements, etc., are within the protection scope of the present disclosure.

What is claimed is:

1. A display panel, wherein the display panel has a display region and a non-display region, and the display panel comprises:
   a base substrate and a plurality of pixels arranged on the base substrate, and a pixel driving circuit;
   wherein the plurality of pixels comprise a plurality of first pixels and a plurality of second pixels, the plurality of first pixels are arranged in an array in a first arrangement region, the plurality of second pixels are arranged in a periphery of the first arrangement region, one part of each of the second pixels is in a second arrangement region and the other part thereof is in a third arrangement region, the first arrangement region and the second arrangement region are in the display region, and the third arrangement region are in the non-display region;
   wherein the pixel driving circuit is configured to drive the plurality of pixels to emit light, and each of the pixels comprises at least two subpixels;
   wherein the pixel driving circuit comprises a target signal line, the target signal line comprising a first target signal line and a second target signal line, and a load voltage on the first target signal line being greater than a load voltage on the second target signal line; and
   wherein a target subpixel in each of the second pixels is connected to the first target signal line, one part of each of target subpixels being in the second arrangement region and the other part thereof being in the third arrangement region, and the subpixels except for the target subpixels in the plurality of pixels are all connected to the second target signal line,
   wherein the target signal line is one of a power signal line and a reference signal line.

2. The display panel according to claim 1, wherein a resistor is arranged between each of the target subpixels and the corresponding first target signal line, a resistance of the resistor is positively correlated with a size of a light-emitting region of the target subpixel, and the voltages loaded to the target subpixels are all greater than the load voltage on the second target signal line.

3. The display panel according to claim 1, wherein the pixel driving circuit further comprises a data signal line to which each of the subpixels is connected, and the data signal line is configured to supply a data voltage for corresponding subpixels.

4. The display panel according to claim 1, wherein each of the pixels comprises a red subpixel, a green subpixel and a blue subpixel.

5. The display panel according to claim 1, wherein the display panel is a circular display panel, and each of the pixels is a rectangular pixel.

6. The display panel according to claim 1, wherein the display panel is an AMOLED display panel.

7. The display panel according to claim 1, wherein the pixel driving circuit is arranged on the base substrate.

8. The display panel according to claim 1, wherein the pixel driving circuit is arranged independently of the base substrate.

9. A display device, comprising a display panel as defined in claim 1.

10. A manufacturing method for a display panel, which has a display region and a non-display region, and the method comprises:
   providing a base substrate; and
   forming a plurality of pixels on the base substrate, each of the plurality of pixels comprising at least two subpixels;
   wherein the plurality of pixels comprise a plurality of first pixels and a plurality of second pixels, the plurality of first pixels are arranged in an array in a first arrangement region, the plurality of second pixels are arranged in a periphery of the first arrangement region, one part of each of the second pixels is in a second arrangement region and the other part thereof is in a third arrangement region, the first arrangement region and the second arrangement region are in the display region, and the third arrangement region is in the non-display region; and
   the method further comprising providing a pixel driving circuit, the pixel driving circuit comprising a target signal line, the target signal line comprising a first target signal line and a second signal target line;
   connecting a target subpixel in each of the second pixels to the first target signal line, the first target signal line being configured to load a first voltage to the target subpixels in the second pixels, one part of each of the target subpixels being in the second arrangement region and the other part thereof being in the third arrangement region; and
   connecting the subpixels except for the target subpixels in the plurality of pixels to the second target signal line, the second target signal line being configured to load a second voltage to the subpixels except for the target subpixels in the plurality of pixels;
   wherein the first voltage is greater than the second voltage,
   wherein the target signal line is one of a power signal line and a reference signal line.

11. The method according to claim 10, further comprising:
   arranging a resistor between each of the target subpixels and the corresponding first target signal line, a resistance of the resistor being positively correlated with a size of a light-emitting region of the target subpixel, and the voltages loaded to the target subpixels being all greater than the second voltage.

12. The method according to claim 10, wherein the pixel driving circuit further comprises a data signal line, and the method further comprises:
   connecting each of the subpixels to the data signal line that is configured to load a data voltage for each of the subpixels.

\* \* \* \* \*